United States Patent [19]

Shen et al.

[11] Patent Number: 5,688,717

[45] Date of Patent: Nov. 18, 1997

[54] CONSTRUCTION THAT PREVENTS THE UNDERCUT OF INTERCONNECT LINES IN PLASMA METAL ETCH SYSTEMS

[75] Inventors: Lewis Shen, Cupertino; Sheshadri Ramaswami, San Jose; Mark Chang, Los Altos; Robin Cheung, Cupertino, all of Calif.

[73] Assignee: Advanced Micro Devices, Inc., Sunnyvale, Calif.

[21] Appl. No.: 565,308

[22] Filed: Nov. 30, 1995

Related U.S. Application Data

[63] Continuation of Ser. No. 250,985, May 31, 1994, abandoned.

[51] Int. Cl.⁶ .................................................. H01L 21/28
[52] U.S. Cl. .......................... 437/190; 437/192; 437/194; 437/228; 156/656.1
[58] Field of Search ........................... 437/190, 192, 437/194, 228; 257/763, 751; 156/656.1

[56] References Cited

U.S. PATENT DOCUMENTS

| | | | |
|---|---|---|---|
| 4,960,732 | 10/1990 | Dixit et al. | 437/192 |
| 5,155,063 | 10/1992 | Ito | 437/192 |
| 5,162,262 | 11/1992 | Ajiko et al. | 437/192 |
| 5,207,868 | 5/1993 | Shinohara | 437/194 |
| 5,275,715 | 1/1994 | Tuttle | 437/192 |
| 5,345,108 | 9/1994 | Kikkawa | 257/751 |
| 5,378,653 | 1/1995 | Yanagida | 437/194 |
| 5,380,678 | 1/1995 | Yu et al. | 437/190 |
| 5,420,070 | 5/1995 | Matsuura et al. | 437/194 |
| 5,427,666 | 6/1995 | Mueller et al. | 437/190 |

FOREIGN PATENT DOCUMENTS

| | | |
|---|---|---|
| 0 354 717 | 2/1990 | European Pat. Off. . |
| 06-104227 | 4/1992 | Japan . |
| 05-152245 | 6/1993 | Japan . |

OTHER PUBLICATIONS

S. Wolf, "Silicon Processing for the VLSI Era, vol. 2", Lattice Press, pp. 194–199, Jun. 1990.
S. Wolf, "Silicon Processing for the VLSI Euo, vol. I", Lottice Press 1986, p. 407.

Primary Examiner—John Niebling
Assistant Examiner—Thomas G. Bilodeau
Attorney, Agent, or Firm—Benman & Collins

[57] ABSTRACT

A $Ti_xN_y$ layer, not necessarily stoichiometric, is interposed between a titanium or aluminum interconnect layer to improve adhesion and prevent re-entrant undercutting and lifting of the interconnect layer during the process of patterning and plasma etching to form interconnect lines on a substrate, such as an oxide.

15 Claims, 1 Drawing Sheet

CONSTRUCTION THAT PREVENTS THE UNDERCUT OF INTERCONNECT LINES IN PLASMA METAL ETCH SYSTEMS

This a continuation of application Ser. No. 08/250,985 filed May 31, 1994, now abandoned.

TECHNICAL FIELD

The present invention relates generally to the fabrication of semiconductor devices, and, more particularly, to improving the adherence of interconnect lines.

BACKGROUND ART

Interconnect layers comprising multi-layers such as titanium nitride on aluminum on titanium (Ti/Al/TiN) are sequentially sputter-deposited on substrates, typically silicon dioxide. As used herein, the term "substrate" refers to the base layer on which a metal layer is deposited, and such substrate may itself comprise a layer formed on a lower layer or wafer surface. The interconnect layers are patterned and then plasma etched to form conducting lines. The titanium nitride (outermost) layer is used as an anti-reflection coating (ARC) layer.

A problem that has been observed is that at the completion of the plasma etching process, there is re-entrant undercutting at the Al/Ti interface, which can lead to undesirable voids during subsequent filling with an intermetal layer dielectric or, in the worst case, subsequent lifting of the aluminum layer, either of which degrades the yield of semiconductor devices.

A process is required that prevents the re-entrant undercutting and potential subsequent lifting of the inter-connect conducting lines and that results in better adherence of the conducting lines to the substrate.

DISCLOSURE OF INVENTION

In accordance with the invention, a nitrogen-containing titanium layer, not necessarily stoichiometric titanium nitride (TiN), is interposed between the aluminum layer and the oxide substrate. The nitrogen-containing titanium layer may be first formed on the oxide substrate, followed by the titanium layer and then the aluminum layer, or the nitrogen-containing titanium layer may be formed following deposition of the titanium layer on the oxide substrate and prior to deposition of the aluminum layer so as to be interposed between the titanium layer and the aluminum layer.

The presence of nitrogen-containing titanium layer improves the adherence of the interconnect conducting lines and prevents re-entrant undercutting and lifting of the lines.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventor for practicing the invention. Alternative embodiments are also briefly described as applicable.

Figure 1:
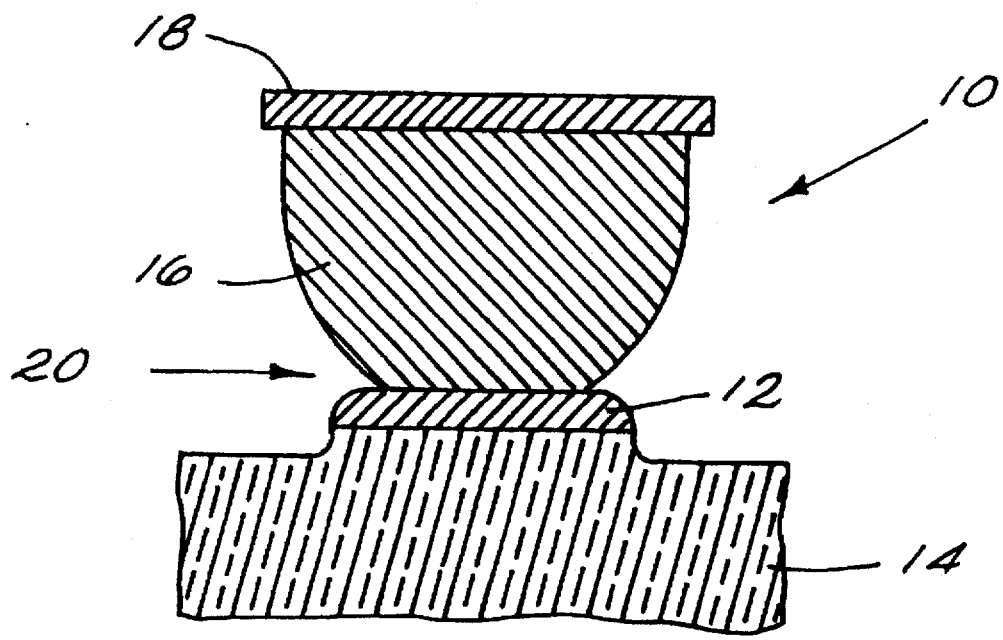
FIG. 1 is a cross-sectional view depicting re-entrant undercutting of an interconnect line comprising titanium and aluminum formed on an oxide layer.

FIG. 1 illustrates the re-entrant undercutting of an interconnect line 10 following patterning and plasma etching, using conventional process procedures. The interconnect line comprises a titanium layer 12, ranging from about 0.01 to 0.1 μm in thickness, which is deposited on top of an oxide substrate 14, followed by an aluminum layer 16, ranging from about 0.2 to 1.5 μm in thickness, deposited on top of the titanium layer, and an anti-reflection titanium nitride layer 18, ranging from about 0.03 to 0.11 μm in thickness, deposited on top of the aluminum layer. The oxide substrate 14 is typically a plasma-enhanced oxide, used as an intermetal layer dielectric. The re-entrant undercut region is indicated at 20.

The presence of the re-entrant undercut region 20 leads to the presence of voids (not shown) during subsequent deposition of an inter-metal layer dielectric (not shown). In the worst cast, the presence of the re-entrant undercut region 20 can lead to lifting of the aluminum layer 16. In either case, device yield is adversely affected.

In accordance with the present invention, a titanium layer 22 containing nitrogen is first formed on the oxide substrate 14, prior to depositing the interconnect metal thereon. The thickness of the titanium-nitrogen layer 22 is not critical, other than it be thick enough to be substantially continuous, or about 0.01 to 0.1 μm.

Further, the composition of the $Ti_xN_y$ layer 22 need not necessarily be stoichiometric (x=y=1, titanium nitride), although it may be. It is sufficient that the layer 22 comprise titanium and at least about 10 atomic percent nitrogen. Less than about 10 at % nitrogen does not provide the necessary adherence of the interconnect line 10 to the oxide substrate 14. Thus, the value of x+y is equal to or less than 2 (x+y≦2), with the value of y being at least about 10 at %. For convenience, the titanium-nitrogen layer 22 is referred to herein as "titanium-nitride" or "Ti—N"; however, this is not to imply that the stoichiometric composition is intended.

Figure 2A:
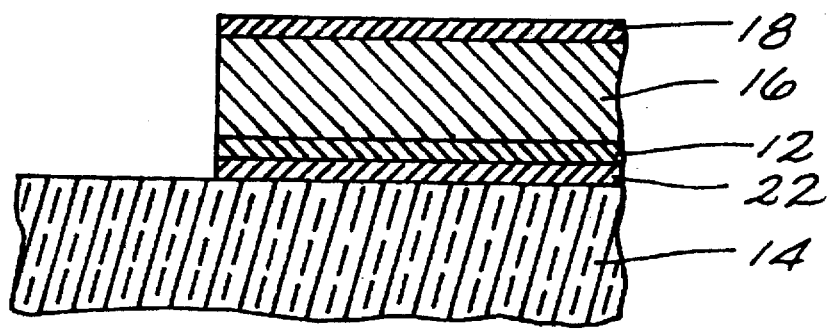
FIG. 2a is a view similar to that of FIG. 1, but showing the presence of a nitrogen-containing titanium layer interposed between the titanium layer and the oxide layer to improve adherence of the interconnect line to the oxide layer.
Figure 2B:
FIG. 2b is a view similar to that of FIG. 2a, but showing the presence of the nitrogen-containing titanium layer interposed between the titanium layer and the aluminum layer.

The Ti—N layer 22 may be formed either on the oxide substrate 14, followed by deposition of the titanium layer 12, as shown in FIG. 2a, or on the titanium layer 12, followed by deposition of the aluminum layer 16, as shown in FIG. 2b.

The Ti—N layer 22 is formed by any of the conventional processes for forming Ti—N layers, and preferably is formed by reactive sputtering of titanium in nitrogen. Formation of the Ti—N layer 22 may be done during deposition of the titanium layer 12, either by initially flowing nitrogen during deposition and then terminating the flow of nitrogen before terminating titanium deposition to form the structure shown in FIG. 2a, or by first initiating deposition of the titanium layer, then initiating the flow of nitrogen, and next terminating both the flow of nitrogen and titanium deposition to form the structure shown in FIG. 2b. Alternatively, the Ti—N layer 22 is formed by first sputtering titanium in argon, then treating in a nitrogen-containing gas at high temperature. For example, the structure depicted in FIG. 2b may be formed by first depositing titanium, then either (a) performing a rapid thermal anneal (RTA) in nitrogen gas ($N_2$), nitrogen oxide ($N_2O$), or ammonia ($NH_3$) at a temperature of about 600° to 800° C. or (b) heating in a furnace in ammonia at a temperature of about 400° to 450° C. for a period of time of about 30 to 60 minutes. Either of the foregoing treatments can convert the titanium surface to the desired Ti—N layer 22.

Without subscribing to any particular theory, it appears that the adherence (or lack thereof) is a result of charge accumulation/dissipation of the titanium and titanium nitride layers when they are close to being completely etched in conventional plasma chemistry. In this connection, it will be appreciated by those skilled in this art that a sheet layer before etch can conduct the charge away very easily; however, at close to the end-point of etching, the interconnect lines 10 form islands that can build up charge. The presence of this charge appears to affect the local concentration of the etching species, and thus impacts the extent of the re-entrant undercut. Titanium and aluminum lines 10 apparently accumulate charge, while the $Ti_xN_y$ layer 20 of the present invention aids in dissipating such charge.

INDUSTRIAL APPLICABILITY

The use of $Ti_xN_y$ to prevent re-entrant undercutting of aluminum interconnects formed over an oxide substrate is expected to be employed in the fabrication of semiconductor devices.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in CMOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. An improvement in a process for reducing re-entrant undercutting of aluminum on titanium interconnect conducting lines formed over a semiconductor substrate, said process comprising:

forming an inter-metal layer dielectric consisting essentially of an oxide; and forming a patterned multi-layer structure on said inter-metal layer dielectric, said patterned multi-layer structure comprising a titanium nitride anti-reflection layer formed on an aluminum layer formed on a titanium layer formed on said oxide layer, the improvement consisting essentially of:

(a) depositing in either order on said oxide to form said inter-metal layer dielectric (1) a layer consisting essentially of nitrogen and titanium and (2) said titanium layer, thereby forming a titanium-containing layer;

(b) depositing said aluminum layer on said titanium-containing layer;

(c) depositing said titanium nitride anti-reflection layer on said aluminum layer; and (d) patterning and etching all metal-containing layers to form said interconnect conducting lines.

2. The process of claim 1 wherein said nitrogen-containing titanium layer is deposited on said oxide layer first, followed by forming said titanium layer thereon.

3. The process of claim 2 wherein said nitrogen-containing titanium layer and said titanium layer are deposited by first supplying a titanium target with both a nitrogen-containing gas and argon gas in a sputtering chamber to form said nitrogen-containing titanium layer and then supplying only argon to form said titanium layer on said nitrogen-containing titanium layer.

4. The process of claim 1 wherein said titanium layer is deposited on said oxide layer first, followed by forming said nitrogen-containing titanium layer thereon.

5. The process of claim 4 wherein said titanium layer and said nitrogen-containing titanium layer are deposited by first supplying a titanium target with argon gas in a sputtering chamber to form said titanium layer and then supplying both a nitrogen-containing gas and argon gas to form said nitrogen-containing titanium layer on said titanium layer.

6. The process of claim 4 wherein said nitrogen-containing titanium layer is formed by first sputtering titanium in argon, then treating in a nitrogen-containing gas at a temperature elevated above room temperature.

7. The process of claim 6 wherein said treating is carried out by rapid thermal annealing at a temperature of about 600° to 800° C. in a nitrogen-containing gas selected from the group consisting of nitrogen gas, nitrogen oxide, and ammonia.

8. The process of claim 6 wherein said treating is carried out in a furnace at a temperature of about 400° to 450° C. for a period of time of about 30 to 60 minutes in ammonia.

9. The process of claim 1 wherein said nitrogen-containing titanium layer is formed by reactive sputtering of titanium in nitrogen gas.

10. The process of claim 1 wherein said nitrogen-containing titanium layer is formed by chemical vapor deposition.

11. The process of claim 1 wherein said nitrogen-containing titanium layer has a composition given by $Ti_xN_y$, where $0<x\leq1$ and $0<y\leq1$ and where the amount of nitrogen is at least 10 atomic percent of said composition.

12. The process of claim 1 wherein said nitrogen-containing titanium layer is formed to a thickness ranging from about 0.01 to 0.1 μm.

13. The process of claim 1 wherein said oxide layer comprises silicon dioxide.

14. The process of claim 1 wherein said oxide layer comprises plasma-enhanced oxide.

15. The process of claim 11 where $x \neq y$.

* * * * *